United States Patent
Vanmaele et al.

(10) Patent No.: US 10,607,746 B2
(45) Date of Patent: Mar. 31, 2020

(54) NON-AQUEOUS DISPERSIONS OF A CONDUCTIVE POLYMER

(71) Applicant: AGFA-GEVAERT, Mortsel (BE)

(72) Inventors: Luc Vanmaele, Mortsel (BE); Tim Van Gijseghem, Mortsel (BE)

(73) Assignee: AGFA GEVAERT, Mortsel (BE)

( * ) Notice: Subject to any disclaimer, the term of this patent is extended or adjusted under 35 U.S.C. 154(b) by 155 days.

(21) Appl. No.: 15/307,018

(22) PCT Filed: Apr. 27, 2015

(86) PCT No.: PCT/EP2015/059074
§ 371 (c)(1),
(2) Date: Oct. 27, 2016

(87) PCT Pub. No.: WO2015/165849
PCT Pub. Date: Nov. 5, 2015

(65) Prior Publication Data
US 2017/0047141 A1 Feb. 16, 2017

(30) Foreign Application Priority Data
Apr. 30, 2014 (EP) .................................... 14166514

(51) Int. Cl.
| | |
|---|---|
| *H01B 1/12* | (2006.01) |
| *H01L 51/00* | (2006.01) |
| *C09D 181/02* | (2006.01) |
| *C09D 5/24* | (2006.01) |
| *C08L 101/00* | (2006.01) |
| *C08L 65/00* | (2006.01) |
| *C08L 35/06* | (2006.01) |
| *C09D 7/63* | (2018.01) |

(52) U.S. Cl.
CPC .............. *H01B 1/127* (2013.01); *C08L 35/06* (2013.01); *C08L 65/00* (2013.01); *C08L 101/00* (2013.01); *C09D 5/24* (2013.01); *C09D 7/63* (2018.01); *C09D 181/02* (2013.01); *H01B 1/122* (2013.01); *H01L 51/0003* (2013.01); *H01L 51/0036* (2013.01); *C08G 2261/3223* (2013.01); *C08G 2261/794* (2013.01); *C08G 2261/91* (2013.01); *C08G 2261/92* (2013.01); *C08G 2261/95* (2013.01); *C08L 2201/56* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2003/0193042 | A1 | 10/2003 | Go et al. |
| 2011/0168946 | A1* | 7/2011 | Loevenich ............. C08L 25/16 252/301.35 |

FOREIGN PATENT DOCUMENTS

| | | | |
|---|---|---|---|
| EP | 1 801 143 A1 | | 6/2007 |
| EP | 2 020 430 A1 | | 2/2009 |
| JP | 60139694 | * | 7/1985 |
| JP | 60168101 | * | 8/1985 |
| JP | 2011-208016 A | | 10/2011 |

OTHER PUBLICATIONS

Machine Translation of JP2011-208016 dated Oct. 2011 (Year: 2011).*
Official Communication issued in International Patent Application No. PCT/EP2015/059074, dated Jul. 17, 2015.

* cited by examiner

*Primary Examiner* — Tanisha Diggs
(74) *Attorney, Agent, or Firm* — Keating and Bennett, LLP

(57) ABSTRACT

A dispersion of a conductive polymer and a polyanion in a non-aqueous medium further includes a compound including an acid sensitive functional group selected from the group consisting of a ketal, an acetal, an aminal, a hemiketal, a hemi-acetal, a hemi-aminal, a thioacetal, an amide acetal, an orthoester, an orthoether, an enolester, an enolether, and an enolamine.

13 Claims, No Drawings

NON-AQUEOUS DISPERSIONS OF A CONDUCTIVE POLYMER

CROSS REFERENCE TO RELATED APPLICATIONS

This application is a 371 National Stage Application of PCT/EP2015/059074, filed Apr. 27, 2015. This application claims the benefit of European Application No. 14166514.1, filed Apr. 30, 2014, which is incorporated by reference herein in its entirety.

BACKGROUND OF THE INVENTION

1. Field of the Invention

The present invention relates to a dispersion of a conductive polymer, in particular a polymer or copolymer of a substituted or unsubstituted thiophene, and a polyanion in a non-aqueous dispersion medium. The present invention also relates to a method of preparing such a dispersion from a freeze dried composition comprising a conductive polymer, in particular a polymer or copolymer of a substituted or unsubstituted thiophene, and a polyanion.

2. Description of the Related Art

The preparation of polythiophenes and dispersions thereof for use in antistatic coatings has been described in the literature e.g. 'Handbook of Organic Conductive Molecules and Polymers', ed. H. S. Nalwa, J. Wiley & Sons, 1997. Polythiophenes have conductive properties.

In large scale methods for preparing aqueous dispersions of a latex comprising a polyanion and a polymer or copolymer of a substituted or unsubstituted thiophene, the solid content of the aqueous dispersions is limited to only a few percent, due to production reasons such as the need for ultrafiltration, the viscosity of the dispersion etc. It should be noted that such dispersions are often erroneously referred to as solutions due to the very small particle size, i.e. 20 to 50 nm, of the polythiophene/polyanion latex. Shipment of such dilute dispersions is expensive and cumbersome in view of the high volume and weight associated therewith.

For instance, PEDOT, i.e. poly(3,4-ethylenedioxythiophene) in combination with PSS (PSS as used in the present disclosure stands for poly(styrene sulfonic acid) or poly(styrene sulfonate)), is produced industrially as an aqueous dispersion of approximately 1 wt % of PEDOT/PSS. However many potential applications for PEDOT/PSS require a non-aqueous dispersion in which the concentration of water is as low as possible, while retaining or increasing the concentration of thiophene polymers or co-polymers. Various methods such as e.g. simple evaporation of the water (WO99/34371), dehydratation by dialysis (WO02/42352), azeotropic distillation (WO 02/072660), flash evaporation (WO 03/087222) and solvent addition followed by evaporation of the water (WO 03/48228, WO 03/048229) have been investigated to obtain these concentrated dispersions.

EP-A 1801143 discloses a coating solution or dispersion comprising a redispersible or soluble product obtainable as a dry product or as a paste by freeze drying an aqueous dispersion of a latex comprising a polyanion and a polymer or copolymer of a substituted or unsubstituted thiophene. The water content of the coating solution or dispersion may be less than 12 wt %, preferably less than 6 wt % relative to the total weight of the dispersion.

The presence of water in a non-aqueous dispersion of a polymer or copolymer of a substituted or unsubstituted thiophene and a polyanion may have a negative influence on the conductivity of coatings obtained from such dispersions. Also, in some applications wherein conductive polymers may be used, for example OLED, OPV (Organic Photovoltaic), Dye Sensitized Solar Cells (DSSC) and also solar cells based on Perovskites, the presence of a minor amount of water may have a detrimental effect on the performance and lifetime of the devices.

SUMMARY OF THE INVENTION

Preferred embodiments of the present invention provide a substantially water free dispersion of a conductive polymer, in particular a polymer or copolymer of a substituted or unsubstituted thiophene, and a polyanion in a non-aqueous dispersion medium of which the optical and conductive properties of coatings or patterns obtained thereof remain at a sufficient level.

Other preferred embodiments of the present invention provide a method of preparing such a substantially water free dispersion from a freeze dried composition comprising a conductive polymer, in particular a polymer or copolymer of a substituted or unsubstituted thiophene, and a polyanion.

DETAILED DESCRIPTION OF THE PREFERRED EMBODIMENTS

The term "alkyl" means all variants possible for each number of carbon atoms in the alkyl group such as but not limited to methyl; ethyl; for three carbon atoms: n-propyl and isopropyl; for four carbon atoms: n-butyl, isobutyl and tertiary-butyl; for five carbon atoms: n-pentyl, 1,1-dimethylpropyl, 2,2-dimethylpropyl and 2-methyl-butyl; etc.

The term "alkoxy" means all variants possible for each number of carbon atoms in the alkoxy group such as but not limited to methoxy; ethoxy; for three carbon atoms: n-propoxy and isopropoxy; for four carbon atoms: n-butoxy, isobutoxy and tertiary-butoxy; etc.

Unless otherwise specified a substituted or unsubstituted alkyl group is preferably a $C_1$ to $C_6$-alkyl group.

Unless otherwise specified a substituted or unsubstituted alkenyl group is preferably a $C_1$ to $C_6$-alkenyl group.

Unless otherwise specified a substituted or unsubstituted alkynyl group is preferably a $C_1$ to $C_6$-alkynyl group.

Unless otherwise specified a substituted or unsubstituted aralkyl group is preferably a phenyl or naphthyl group including one, two, three or more $C_1$ to $C_6$-alkyl groups.

Unless otherwise specified a substituted or unsubstituted aryl group is preferably a phenyl group or naphthyl group Unless otherwise specified a substituted or unsubstituted heteroaryl group is preferably a five- or six-membered ring substituted by one, two or three oxygen atoms, nitrogen atoms, sulphur atoms, selenium atoms or combinations thereof.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

Unless otherwise specified a substituted alkyl group, a substituted alkenyl group, a substituted alkynyl group, a substituted aralkyl group, a substituted aryl, a substituted heteroaryl and a substituted heterocyclic group are preferably substituted by one or more substituents selected from the group consisting of methyl, ethyl, n-propyl, isopropyl, n-butyl, 1-isobutyl, 2-isobutyl and tertiary-butyl, acid, ester, amide, ether, thioether, ketone, aldehyde, sulfoxide, sulfone, sulfonate ester, sulphonamide, —Cl, —Br, —I, —OH, —SH, —CN, COOH and —NO$_2$.

The term "Freeze-drying" as used herein means a lyophilization process in which a substance is first frozen and then the quantity of solvent (generally water) is reduced, first by sublimation (=primary drying process) and then by desorption (=secondary drying process) until the temperature of the shelves becomes equal to the atmospheric temperature in the freeze dryer. The freeze-drying process is enabled by the ability of solid materials such as ice to sublime (change directly into a gas without passing through a liquid phase) under the right conditions.

The term "acid sensitive functional group" as used herein means a functional group that reacts in an acid medium with for example water.

Non-Aqueous Dispersions of a Conductive Polymer and a Polyanion

The dispersion of a conductive polymer and a polyanion in a non-aqueous medium according to preferred embodiments of the present invention further comprises a compound having an acid sensitive functional group selected from the group consisting of a ketal, an acetal, an aminal, a hemi-ketal, a hemi-acetal, a hemi-aminal, a thioacetal, an amide acetal, an orthoester, an orthoether, an enolester, an enolether, and an enolamine.

The dispersion may comprise further ingredients to optimize the dispersion stability, for example surfactants and/or dispersants, or to optimize its properties in function of the application for which the dispersion is used.

The dispersion contains less than 2.0 wt %, preferably less than 1.0 wt %, more preferably less than 0.1 wt %, most preferably less than 0.01 wt % of water, relative to the total weight of the dispersion. Such a dispersion is also referred to as a substantially water free dispersion.

Compounds Having an Acid Sensitive Functional Group

The compound having an acid sensitive functional group is selected from the group consisting of a ketal, an acetal, an aminal, a hemi-ketal, a hemi-acetal, a hemi-aminal, a thioacetal, an amide acetal, an orthoester, an orthoether, an enolester, an enolether, and an enolamine.

The compound having an acid sensitive functional group is preferably selected from the group consisting of a ketal, an acetal, and an orthoester.

A particularly preferred compound having an acid sensitive functional group is an orthoester.

Preferred orthoesters are those according to Formula I,

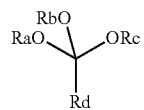

Formula I wherein

Ra, Rb, Rc independently represent a substituted or unsubstituted alkyl group, a substituted or unsubstituted alkenyl group, a substituted or unsubstituted alkynyl group, a substituted or unsubstituted aralkyl group, a substituted or unsubstituted aryl group, a substituted or unsubstituted heteroaryl group or a substituted or unsubstituted heterocyclic group;

Rd represents a hydrogen, a substituted or unsubstituted alkyl group, a substituted or unsubstituted alkenyl group, a substituted or unsubstituted alkynyl group, a substituted or unsubstituted aralkyl group, a substituted or unsubstituted aryl group, a substituted or unsubstituted heteroaryl group or a substituted or unsubstituted heterocyclic group; or Ra together with Rb or Rc may represent the necessary atoms to form a substituted or unsubstituted ring; or Rb together with Rc may represent the necessary atoms to form a substituted or unsubstituted ring; or Rd together with Ra, Rb or Rc may represent the necessary atoms to form a substituted or unsubstituted ring.

Preferably Ra, Rb, Rc and Rd are substituted or unsubstituted C1-C6 alkyl groups.

Highly preferred orthoesters according to Formula I are trimethyl orthoacetate, triethyl orthoacetate, trimethyl orthopropionate, and triethyl orthopropionate.

Another example of an orthoester that may be used in the present invention are those according to Formula II,

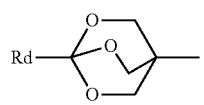

Formula II wherein Rd has the same meaning as in Formula I.

Compounds according to Formula II are referred to as compounds comprising an "OBO protecting group" (4-methyl-2,6,7-trioxa-bicyclo[2.2.2]octan-1-yl) which is formed by the action of (3-methyloxetan-3-yl)methanol on activated carboxylic acids in the presence of Lewis acids and was developed by Elias James Corey.

The amount of the compound having an acid sensitive functional group is preferably sufficient to remove substantially all the water present in the dispersion. More preferably an excess of the compound having an acid sensitive functional group relative to the water present in the dispersion is used. The amount of the compound having an acid sensitive functional group is preferably from 0.5 to 5 wt %, more preferably from 1.0 to 2.5 wt % relative to the total weight of the dispersion.

Preferably compounds having an acid sensitive functional group are used, which form upon reaction with water volatile compounds, such as for example alchols, esters or ketones, which may be removed at moderate temperatures. Preferably both the compounds having an acid sensitive functional group and their reaction products may be substantially removed at moderate temperatures during the preparation of the devices in which the dispersions are used to avoid any contamination resulting in inferior properties of such devices.

The compounds having an acid sensitive functional group and their reaction products preferably have a boiling point at atmospheric pressure below 200° C., more preferably below 150° C., most preferably below 100° C. Preferred reaction products are for example methanol, ethanol, ethylacetate, or acetone. For example triethyl orthoacetate forms ethanol and ethylacetate upon reaction with water; 2,2-dimethoxypropane forms acetone and methanol upon reaction with water.

Preferably the compound having an acid sensitive functional group and its reaction products do not substantially influence the performance of coatings obtained from the conductive dispersions. The compounds preferably do not adversibly influence the conductivity, the optical properties such as Haze or visual transmittance, or the physical and chemical properties of such coatings.

Polyanion

Examples of polyanions suitable for use in the freeze-dried composition are those disclosed in EP-A 440957. These polyanions are for instance formed from polyacids or can be added as a salt of the corresponding polyacids, e.g. an alkali salt.

In a preferred preferred embodiment of the present invention, the polyanion is the anion of a polymeric carboxylic acid, such as poly(acrylic acid), poly(methacrylic acid) and poly(maleic acid), or of a polymeric sulphonic acid, such as poly(styrene sulphonic acid) or poly(vinyl sulphonic acid). These polycarboxylic acids and polysulphonic acids can also be copolymers of vinylcarboxylic acids and/or vinylsulphonic acids with other polymerizable monomers, e.g. acrylic acid esters, methacrylic acid esters and styrene.

In a more preferred preferred embodiment of the present invention, the polyanion is the anion of poly(styrene sulphonic acid) or of copolymers thereof with styrene. In a most preferred preferred embodiment of the present invention, the polyanion is poly(styrenesulfonate).

The molecular weight of these polyanion forming polyacids is preferably between 1000 and $2 \times 10^6$ g/mol or more, more preferably between 2000 and $5 \times 10^5$ g/mol.

These polyacids or their alkali salts are commercially available and can be prepared according to the known methods, e.g. as described in Houben-Weyl, Methoden der Organische Chemie, Bd. E20 Makromolekulare Stoffe, Teil 2, (1987), pp. 1141.

Polymer or Copolymer of a Substituted or Unsubstituted Thiophene

Conductive polymers that may be used are disclosed in for example Conducting Polymers, Fundamentals and Applications: A Practical Approach (Prasanna Chandrasekhar), Conducting Polymers: A New Era in Electrochemistry (György Inzelt), Handbook of Organic Conductive Molecules and Polymers: Conductive polymers: synthesis and electrical properties (Hari Singh Nalwa), Conjugated Polymers: Theory, Synthesis, Properties, and Characterization (Terje A. Skotheim, John Reynolds), PEDOT: Principles and Applications of an Intrinsically Conductive Polymer (Andreas Elschner et al.).

Examples of such conductive polymers are polythiophenes, polyanilines, polypyrroles, and polyacetylene.

The conductive polymer is preferably a polymer or copolymer of a substituted or unsubstituted thiophene.

According to a preferred embodiment of the present invention, the thiophene is substituted in at least one of the 3- or 4-positions with a substituent selected from the group consisting of an optionally substituted $C_{1-10}$ alkoxy group, an optionally substituted $C_{1-10}$ alkyl group, and an optionally substituted aryl group, or the 3- and 4-positions are linked with an optionally substituted oxy-$C_{1-4}$ alkylene-oxy group.

The aforementioned alkyl, oxy-alkylene-oxy, cylcloalkylene and alkylene groups may be unsubstituted or may optionally be substituted with 1, 2, 3, 4 or 5 substituent(s) independently selected from the group consisting of phenyl, fluoro, chloro, bromo, iodo, methoxy, ethoxy, propoxy, isopropoxy, butoxy, sec-butoxy, tert-butoxy, nitro, cyano and hydroxy.

The aforementioned alkoxy groups may be unsubstituted or may optionally be substituted with 1, 2, 3, 4 or 5 substituent(s) independently selected from the group consisting of phenyl, fluoro, chloro, bromo, iodo, nitro, cyano and hydroxy.

In a preferred preferred embodiment of the present invention the polymer of a substituted thiophene is represented by Formula III

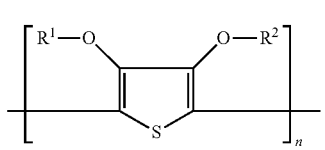

Formula III wherein
$1 < n \leq 10\,000$;
$R^1$ and $R^2$ independently represents hydrogen, a substituted or unsubstituted C1-C4 alkyl group, or together form a substituted or unsubstituted C1-C4 alkylene group or a substituted or unsubstituted C3-C10 cycloalkylene group.

In a preferred preferred embodiment $2 < n \leq 5\,000$.

In another preferred preferred embodiment R1 and R2 independently represent an unsubstituted ethylene group, an unsubstituted methylene group, an optionally alkyl-substituted methylene group, an optionally $C_{1-12}$ alkyl- or phenyl-substituted ethylene group, an unsubstituted 1,3-propylene group or an unsubstituted 1,2-cyclohexylene group.

In another preferred embodiment of the present invention, the polymer or copolymer of a substituted thiophene is a polymer or copolymer of a 3,4-dialkoxy-thiophene in which the two alkoxy groups together form an optionally substituted oxy-alkylene-oxy bridge selected from the group consisting of: 3,4-methylenedioxy-thiophene, 3,4-methylenedioxythiophene derivatives, 3,4-ethylenedioxythiophene, 3,4-ethylene-dioxythiophene derivatives, 3,4-propylenedioxythiophene, 3,4-propylenedioxy-thiophene derivatives, 3,4-butylene-dioxythiophene and 3,4-butylene-dioxy-thiophene derivatives and copolymers therewith.

In yet another preferred embodiment of the present invention, the polymer or copolymer of a substituted thiophene is a polymer or copolymer of a 3,4-dialkoxy-thiophene in which the two alkoxy groups together form an oxy-alkylene-oxy bridge substituted with a substituent selected from the group consisting of alkyl, alkoxy, alkyloxyalkyl, carboxy, alkylsulfonato and carboxy ester groups.

In yet another preferred embodiment of the present invention, the polymer of a substituted thiophene is a poly(3,4-dialkoxy-thiophene) in which the two alkoxy groups together form an optionally substituted oxy-alkylene-oxy bridge which is an unsubstituted 1,2-ethylene group, an unsubstituted methylene group, an optionally alkyl-substituted methylene group, an optionally C1-12 alkyl- or phenyl-substituted 1,2-ethylene group, an unsubstituted 1,3-propylene group or an unsubstituted 1,2-cyclohexylene group.

Such polymers are disclosed in Handbook of Oligo- and Polythiophenes Edited by D. Fichou, Wiley-VCH, Weinheim (1999); by L. Groenendaal et al. in Advanced Materials, volume 12, pages 481-494 (2000); L. J. Kloeppner et al. in Polymer Preprints, volume 40(2), page 792 (1999); P. Schottland et al. in Synthetic Metals, volume 101, pages 7-8 (1999); and D. M. Welsh et al. in Polymer Preprints, volume 38(2), page 320 (1997).

Surfactants and/or Dispersants

The surfactants are preferably anionic or non-ionic.

Preferred surfactants are for example those disclosed in WO2002/00759 in particular MARLON™ A365, AKYPO™, ARKOPAL™ N060, ZONYL™FSO HOSTAPAL™ B, ARKOPON™, MERSOLAT™ or CAPSTONE®.

Other preferred surfactants are those available under the tradename TRITON® X from Dow Chemicals, those under the tradename DYNOL™ from Air Products, and the fluorsurfactants from Chemguard and Synperonic®.

Preferred dispersants are polyoxyethylene alkylamines such as disclosed in for example JP2012-132026. Particularly preferred are the ethoxylated amines, commercially available under the Trade name Ethomeen™ from Akzo Nobel, such as for example Ethomeen C/12, Ethomeen C/25, Ethomeen T/12, Ethomeen S/12, etc.

Other preferred dispersants are hydrophilic glycol ethers, commercially available under the tradename Dowanol™ from Dow Chemicals such as for example Dowanol EPh. Other preferred dispersants are the Dysperbyk®, Ethylan™, Solsperse™, Tilosperse™, Servoxyl™, Surfynol™, Hypermer™, Sokolan™, or Lupasol™ dispersants.

Non-Aqueous Medium

The non-aqueous medium is preferably selected from alcohols, esters, ketones, aldehydes, ethers, or mixtures thereof.

The non-aqueous medium is preferably selected from the group consisting of ethanol, acetone, methyl ethyl ketone (MEK), ethylacetate, isopropylalcohol (IPA), toluene, butylacetate, propylacetate, and mixtures thereof.

Other Ingredients

The dispersion may further comprise other ingredients, depending on the application for which the dispersion will be used.

For example the viscosity of the dispersion may be adapted to the method used to apply the dispersion on a substrate, i.e. the coating and/or printing method.

When used as a screen printing ink, the viscosity is preferably between 3000 and 400000 mPa·s, more preferably between 5000 and 100000 mPa·s, most preferably between 10000 and 50000 mPa·s.

When used as a flexographic or gravure ink, the viscosity is preferably between 50 and 3000 mPa·s, more preferably between 200 and 1000 mPa·s, most preferably between 300 and 500 mPas·s.

When used as an inkjet ink, the viscosity is preferably between 1 and 50 mPa·s, more preferably between 5 and 30 mPa·s, most preferably between 7 and 15 mPa·s.

The viscosities referred to above are measured at a shear rate of 1/s at temperature between 20 and 25° C. (for example with an AR2000 Rheometer from Texas Instruments).

The viscosity may be optimized by adding a binder and/or a thickener. Binders that may be used are polyvinylacetate, polycarbamate, polyvinyl butyral, polyacrylic acid ester, polyacrylic acid amide, polymethacrylic acid ester, polymethacrylic acid amide, polystyrene, polyacrylonitrile, polyvinylchloride, polyvinylpyrrolidine, polybutadiene, polyisoprene, polyethers, polyurethanes, polyamides, polyimides, polysulphones, silicones, epoxy resins, styrene/acrylate copolymers, vinylacetate/acrylate copolymers, ethylene/vinyl acetate copolymers, polyvinyl alcohols, and cellulose.

Particularly preferred binders are Carbopol® Aqua 30, a latex of a copolymer of acrylic acid and ethyl acrylate from Lubrizol; Klucel® L, hydroxypropylcellluclose from Hercules, or Dispercoll™ U VP KA 8481, a polyester urethane copolymer dispersion from Bayer.

The dispersion may also comprise a conductivity enhancing agent.

Suitable conductivity enhancing agents are a linear, branched or cyclic aliphatic $C_{2-20}$ hydrocarbon or an unsubstituted or substituted aromatic $C_{6-14}$ hydrocarbon, preferably an unsubstituted or substituted aromatic $C_{6, 10\ or\ 14}$ hydrocarbon, or a pyran or a furan, said conductivity enhancing agent comprising at least two hydroxy groups or at least one —C(=O)—X or —C(=O)—NYZ group, wherein X denotes —OH and Y and Z independently of one another each represent H or alkyl; or a heterocyclic compound containing at least one lactam group.

Preferred conductivity enhancing agents are e.g. N-methyl-2-pyrrolidone, 2-pyrrolidone, 1,3-dimethyl-2-imidazolidone, N,N,N,N'-tetramethylurea, formamide, dimethylformamide and N,N-dimethylacetamide. Preferred examples are sugar or sugar derivatives such as arabinose, saccharose, glucose, fructose and lactose, or di- or polyalcohols such as sorbitol, xylitol, mannitol, mannose, galactose, sorbose, gluconic acid, ethylene glycol, di- or tri (ethylene glycol), 1,1,1-trimethylol-propane, 1,3-propanediol, 1-,2-propane-diol, 1,5-pentanediol, 1,2,3-propanetriol, 1,2,4-butanetriol, 1,2,6-hexanetriol, or aromatic di- or polyalcohols such as resorcinol.

Particularly preferred conductivity enhancing agents for use in the freeze-dried composition, ink or aqueous or organic solvent solution or dispersion, according to a preferred embodiment of the present invention are: N-methylpyrrolidinone and diethylene glycol.

The dispersion may also comprise adhesion promoting compounds to optimize the adhesion of coatings or patterns obtained with the dispersion on various substrates. Preferred adhesion promoting compounds are organosilane compounds, in particular alkoxysilane compounds such as methyltrimethoxysilane, methyltriethoxysilane, dimethyldimethoxysilane, propyltrimethoxysilane, isobutyltrimethoxysilane, phenyltrimethoxysilane, n-octyltriethoxysilane, or glycidoxypropyl trimethyloxysilane all available from Dow Corning.

Preparation of the Polymer or Copolymer of a Substituted or Unsubstituted Thiophene The above described polythiophene is preferably prepared in the presence of a polyanion as described above. Such a preferred preparation method is described in EP-A-440 957 and corresponding U.S. Pat. No. 5,300,575.

Basically the preparation of polythiophene may proceed in the presence of polymeric polyanion compounds, such as polystyrenesulfonic acid by oxidative polymerisation of 3,4-dialkoxythiophenes or 3,4-alkylene-dioxythiophenes according to Formula IV:

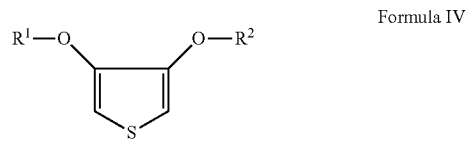

Formula IV wherein R1 and R2 have the same meaning as R1 and R2 in Formula III.

Preparation of a Freeze Dried Composition of a Conductive Polymer and a Polyanion The dispersion is preferably prepared starting from a freeze-dried composition comprising a polymer or copolymer of a substituted or unsubstituted thiophene and a polyanion.

A preferred freeze-drying method is disclosed in EP-A 1309646.

The first step in freeze-drying a product is to convert it into a frozen state. During the freezing process the solvent (e.g. water) is preferably crystallized. In the case of water, the formation of ice crystals results in a separation of the solutes and the solvent. Then the ice crystals are removed by sublimation under vacuum conditions. While the sublimation or primary drying process removes most of the water from the frozen matrix, there can still be a substantial amount, for example more than 5 wt %, of water present in the freeze-dried composition. That remaining water may be removed by desorption. Products freeze-dried at room temperature typically have a water content of 15 to 20% by weight. Further drying of the freeze-dried product in a vacuum drying cupboard at 110° C. and a drying cupboard at 110° C. may results in products which are more difficult to disperse.

The freeze-dried composition may be present in the form of a dry, spongy, woolly powder, a concentrated dispersion or a paste. In a particular preferred preferred embodiment the freeze-dried composition is present as pellets.

The freeze-dried composition may contain, in addition to the conductive polymer and the polyanion a surfactant and/or dispersant.

Method to Prepare the Dispersions of a Conductive Polymer and a Polyanion

A method according to a preferred embodiment of the present invention of preparing a substantially water free dispersion of a conductive polymer and a polyanion comprises the steps of:

redispersing a freeze dried composition comprising a conductive polymer and a polyanion in a non-aqueous medium;

adding a compound having an acid sensitive functional group selected from the group consisting of a ketal, an acetal, an aminal, a hemi-ketal, a hemi-acetal, a hemi-aminal, a thioacetal, an amide acetal, an orthoester, an orthoether, an enolester, an enolether, and an enolamine.

Preferably a surfactant and/or a dispersant as described above are also added to prepare the dispersion. The amount of the surfactant and/or the dispersant is preferably between 0.05 and 10 wt %, more preferably between 0.1 and 5.0 wt %, most preferably between 0.5 and 2.5 wt % relative to the total weight of the dispersion.

The amount of the freeze dried composition comprising a conductive polymer and a polyanion is preferably between 0.05 and 10 wt %, more preferably between 0.1 and 5.0 wt %, most preferably between 0.5 and 2.5 wt % relative to the total weight of the dispersion.

To prepare the non-aqueous dispersion, well known dispersion technologies and devices may be used. Good results, i.e. homogeneous dispersions, were obtained with dissolvers from Disperlux, with Ultra-Turrax® systems from IKA.

Also ball-milling and bead-milling devices may be used to obtain homogeneous non-aqueous dispersions. Good results were also obtained with a Microfluidizer® from Microfluidics.

The amount of water present in the freeze dried composition, or in the redispersed freeze dried composition, may be determined to optimize the amount of the compound having an acid sensitive functional group. Preferably an excess of the compound having an acid sensitive functional group relative to the water present in the dispersion is used.

The amount of the compound having an acid sensitive functional group is preferably from 0.5 to 5 wt %, more preferably from 1.0 to 2.5 wt % relative to the total weight of the dispersion.

Conductive Layers or Patterns

Conductive layers or patterns may be obtained by applying the dispersion according to a preferred embodiment of the present invention on a substrate.

The conductive layers or patterns are prepared by a method comprising the steps of applying the dispersion as defined above on a substrate followed by a drying step.

The conductive layers or patterns may be applied by inkjet printing or by any conventional printing technique such as flexography, offset, gravure or screen printing or by any conventional coating technique such as spray coating, blade coating, or slot die coating.

The conductive layers or patterns may be used in various electronic devices or parts of such electronic devices as for example OLED, OPV, Dye Sensitized Solar Cell (DSSC) or a solar cell based on Perovskites.

EXAMPLES

Materials

All materials used in the following examples were readily available from standard sources such as ALDRICH CHEMICAL Co. (Belgium) and ACROS (Belgium) unless otherwise specified.

The water used was deionized water.

Ethomeen C25: commercially available from AKZO NOBEL.

Orgacon Dry Pellets: commercially available from Agfa Gevaert NV.

Hydranal® Composite 5: commercially available from Sigma-Aldrich.

DMP: 2,2-dimethoxypropane commercially available from Sigma-Aldrich.

TEOA: triethyl orthoacetate commercially available from Sigma-Aldrich.

TMOA: trimethyl orthoacetate commercially available from Sigma-Aldrich.

Measurement Methods

Determination of the Water Content

A volumetric Karl Fischer titration was used to determine the water content of the dispersion. Hydranal® Composite 5 was used as Karl Fischer reagent.

Determination of the SER

The surface resistance SER was measured using a two point probe method.

Determination of the Haze

The haziness of the samples was measured by means of a Haze-Gard plus from Byk-Gardner.

Determination of the Visual Light Transmission (VLT)

The transmittance of the samples was measured by means of a Haze-Gard plus Byk-Gardner.

Preparation PEDT/PSS Dispersions DISP-01 and DISP-02

392 g of isopropanol (Acros, 99+ extra pure), was disposed in a stainless steel vessel. Subsequently 4 g of a polymeric dispersing agent (ethomeen C25) was added and stirred until complete dissolution. Finally, 4 g of Orgacon Dry pellets were added while stirring the mixture. The obtained mixture was then submitted to a Disperlux high shear treatment during 30 minutes. Finally, a finishing step was performed via a Netzsch milling process during 54 minutes resulting in the dispersion DISP-01.

DISP-02 was prepared by adding at room temperature 1.34 g of TEOA to 1.3 g of DISP-01 under stirring for a few minutes.

The water content of DISP-01 and DISP-02, measured as described above, is shown in Table 1.

TABLE 1

| Sample | H₂O content (wt %) |
|---|---|
| DISP-01 | 1.01 |
| DISP-02 | <0.04* |

*below the detection limit of the method used

It is clear from Table 1 that the addition of a compound having an acid sensitive functional group according to preferred embodiments of the present invention, such as triethyl orthoacetate, results in a substantially water free dispersion of PEDOT/PSS in a non-aqueous medium.

Preparation PEDT/PSS Dispersions DISP-03 and DISP-11

DISP-03 to DISP-11 were prepared by first bubbling $N_2$ through 100 g of DISP-01 in a vessel for 30 minutes. Then, after adding the compounds of Table 2 the vessels were sealed and the resulting dispersions stirred for another 60 minutes.

The dispersions were then coated on a (subbed) PET support (thickness=125 μm) with a bar coater at a wet coating thickness of 40 μm and dried at 130° C. for 6 minutes.

The VLT, HAZE and SER, measured as described above are given in Table 2.

TABLE 2

| Sample | SCA* | [SCA] wt %** | % VLT | % HAZE | SER (kΩ/□) |
|---|---|---|---|---|---|
| DISP-03 | DMP | 1.0 | 79.43 | 9.91 | 0.910 |
| DISP-04 | DMP | 3.0 | 81.40 | 8.75 | 1.000 |
| DISP-05 | DMP | 5.0 | 80.97 | 10.30 | 0.931 |
| DISP-06 | TEOA | 1.0 | 80.20 | 7.94 | 0.873 |
| DISP-07 | TEOA | 3.0 | 81.10 | 7.27 | 1.073 |
| DISP-08 | TEOA | 5.0 | 81.27 | 8.08 | 1.173 |
| DISP-09 | TMOA | 1.0 | 81.20 | 6.57 | 0.974 |
| DISP-10 | TMOA | 3.0 | 81.43 | 8.61 | 0.981 |
| DISP-11 | TMOA | 5.0 | 80.83 | 10.15 | 0.859 |
| DISP-01 | — | — | 78 | 6.52 | 0.780 |

*compound having acid sensitive functional group.
**% relative to the total weight of the dispersion It is clear from the results shown in Table 2 that adding a compound having an acid sensitive functional group according to preferred embodiments of the present invention to a non-aqueous dispersion of PEDOT/PSS does not have a significantly negative influence on the electrical and optical properties of coatings obtained with the dispersions.

The invention claimed is:

1. A dispersion comprising:
   a conductive polymer and a polyanion dispersed in a non-aqueous medium; and
   a compound including an orthoester as an acid sensitive functional group; wherein
   the orthoester has a formula according to Formula I,

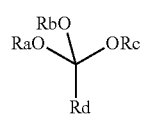

Formula I wherein
   Ra, Rb, and Rc independently represent a substituted or unsubstituted alkyl group, a substituted or unsubstituted alkenyl group, a substituted or unsubstituted alkynyl group, a substituted or unsubstituted aralkyl group, a substituted or unsubstituted aryl group, a substituted or unsubstituted heteroaryl group, or a substituted or unsubstituted heterocyclic group;
   Rd represents hydrogen, a substituted or unsubstituted alkyl group, a substituted or unsubstituted alkenyl group, a substituted or unsubstituted alkynyl group, a substituted or unsubstituted aralkyl group, a substituted or unsubstituted aryl group, a substituted or unsubstituted heteroaryl group, or a substituted or unsubstituted heterocyclic group;
   Ra together with Rb or Rc represent necessary atoms to form a substituted or unsubstituted ring;
   Rb together with Rc represent necessary atoms to form a substituted or unsubstituted ring; or Rd together with Ra, Rb, or Rc represent necessary atoms to form a substituted or unsubstituted ring.

2. The dispersion according to claim 1, wherein Ra, Rb, Rc, and Rd are substituted or unsubstituted C1-C6 alkyl groups.

3. The dispersion according to claim 1, wherein the compound, upon reaction with water, forms reaction products having a boiling point Bp at atmospheric pressure below 200° C.

4. The dispersion according to claim 1, wherein the conductive polymer is a polymer or copolymer of a substituted or unsubstituted thiophene.

5. The dispersion according to claim 4, wherein the polymer of the substituted or unsubstituted thiophene is represented by Formula III,

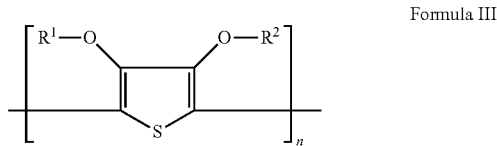

Formula III wherein
   1<n≤10 000; and
   $R^1$ and $R^2$ independently represent hydrogen, a substituted or unsubstituted C1-C4 alkyl group, or together form a substituted or unsubstituted C1-C4 alkylene group or a substituted or unsubstituted C3-C10 cycloalkylene group.

6. The dispersion according to claim 1, wherein the polyanion is poly(styrenesulfonate).

7. The dispersion according to claim 1, wherein the non-aqueous medium is selected from the group consisting of ethanol, acetone, methyl ethyl ketone (MEK), ethylacetate, isopropylalcohol (IPA), toluene, butylacetate, propylacetate, and mixtures thereof.

8. The dispersion according to claim 1, further comprising a polyoxyethylene alkylamine dispersant.

9. A coating or pattern comprising:
   a substrate; and
   a dispersion as defined in claim 1 on the substrate.

10. An electronic device comprising:
   the coating or pattern as defined in claim 9.

11. The electronic device according to claim 10, wherein the electronic device is an OLED, OPV (Organic Photovoltaic), Dye Sensitized Solar Cell (DSSC), or a solar cell based on Perovskites.

12. A method for preparing a dispersion of a conductive polymer and a polyanion comprising the steps of:
   preparing a substantially water free dispersion of a conductive polymer and a polyanion;

redispersing a freeze dried composition including the conductive polymer and the polyanion in an non-aqueous medium; and adding to the dispersion a compound including an orthoester as an acid sensitive functional group; wherein the orthoester has a formula according to Formula I,

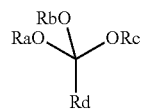

Formula I wherein

Ra, Rb, and Rc independently represent a substituted or unsubstituted alkyl group, a substituted or unsubstituted alkenyl group, a substituted or unsubstituted alkynyl group, a substituted or unsubstituted aralkyl group, a substituted or unsubstituted aryl group, a substituted or unsubstituted heteroaryl group, or a substituted or unsubstituted heterocyclic group;

Rd represents hydrogen, a substituted or unsubstituted alkyl group, a substituted or unsubstituted alkenyl group, a substituted or unsubstituted alkynyl group, a substituted or unsubstituted aralkyl group, a substituted or unsubstituted aryl group, a substituted or unsubstituted heteroaryl group, or a substituted or unsubstituted heterocyclic group;

Ra together with Rb or Rc represent necessary atoms to form a substituted or unsubstituted ring;

Rb together with Rc represent necessary atoms to form a substituted or unsubstituted ring; or Rd together with Ra, Rb ,or Rc represent necessary atoms to form a substituted or unsubstituted ring.

13. The method according to claim 12, wherein an amount of the compound is from 0.5 to 5.0 wt % relative to a total weight of the dispersion.

* * * * *